(12) United States Patent
Cical et al.

(10) Patent No.: US 10,236,873 B2
(45) Date of Patent: Mar. 19, 2019

(54) ANALOG SWITCH HAVING REDUCED GATE-INDUCED DRAIN LEAKAGE

(71) Applicant: Xilinx, Inc., San Jose, CA (US)

(72) Inventors: Ionut C. Cical, Saggart (IE); John K. Jennings, Glenageary (IE); Chandrika Durbha, Secunderabad (IN)

(73) Assignee: XILINX, INC., San Jose, CA (US)

( * ) Notice: Subject to any disclaimer, the term of this patent is extended or adjusted under 35 U.S.C. 154(b) by 109 days.

(21) Appl. No.: 14/659,747

(22) Filed: Mar. 17, 2015

(65) Prior Publication Data

US 2016/0277019 A1  Sep. 22, 2016

(51) Int. Cl.
*H03K 17/16* (2006.01)
*H03K 17/06* (2006.01)
*H03K 3/012* (2006.01)

(52) U.S. Cl.
CPC .......... *H03K 17/161* (2013.01); *H03K 3/012* (2013.01); *H03K 17/063* (2013.01); *H03K 17/165* (2013.01); *H03K 2217/0054* (2013.01)

(58) Field of Classification Search
CPC .. H03K 17/161; H03K 17/6874; H03K 3/012; H03K 17/164; H03K 2217/0054
See application file for complete search history.

(56) References Cited

U.S. PATENT DOCUMENTS

| 8,228,109 B2 * | 7/2012 | Stockinger ........... H03K 17/102 327/318 |
| 2007/0285149 A1 | 12/2007 | Nakatani et al. |
| 2014/0361825 A1 | 12/2014 | Sato |
| 2015/0014779 A1 | 1/2015 | Jennings et al. |

* cited by examiner

Primary Examiner — Lincoln D Donovan
Assistant Examiner — Colleen O Toole
(74) Attorney, Agent, or Firm — Robert M. Brush

(57) ABSTRACT

In an example, an apparatus includes an analog switch having an n-type metal oxide semiconductor (NMOS) circuit in parallel with a p-type metal oxide semiconductor (PMOS) circuit between a switch input and a switch output. The analog switch is responsive to an enable signal that determines switch state thereof. The NMOS circuit includes a switch N-channel transistor coupled to a buffer N-channel transistor, a gate of the switch N-channel transistor coupled to the enable signal and a gate of the buffer N-channel transistor coupled to a modulated N-channel gate voltage. The PMOS circuit including a switch P-channel transistor coupled to a buffer P-channel transistor, a gate of the switch P-channel transistor coupled to a complement of the enable signal and a gate of the buffer P-channel transistor coupled to a modulated P-channel gate voltage. A control circuit is coupled to the analog switch to provide the modulated N-channel and modulated P-channel gate voltages each of which alternates between a respective supply voltage and a respective gate induced drain leakage (GIDL) mitigation voltage based on the switch state.

17 Claims, 5 Drawing Sheets

US 10,236,873 B2

ANALOG SWITCH HAVING REDUCED GATE-INDUCED DRAIN LEAKAGE

TECHNICAL FIELD

Examples of the present disclosure generally relate to electronic circuits and, in particular, to an analog switch having reduced gate-induced drain leakage.

BACKGROUND

A basic complementary metal oxide semiconductor (CMOS) switch comprises an N-channel transistor in parallel with a P-channel transistor. The sources of the N- and P-channel transistors comprise an input of the switch, and the drains of the N- and P-channel transistors comprise an output of the switch. The gates of the N- and P-channel transistors are coupled to complementary enable signals that control the state of the CMOS switch. An enable signal is coupled to the gate of the N-channel transistor, and a complement of the enable signal is coupled to the gate of the P-channel transistor. When an enable signal is logic high, the switch is "on" the switch samples the input voltage. When the enable signal is logic low, the switch is "off".

The main sources of leakage in the off-state are the sub-threshold leakage current and the gate-induced drain leakage (GIDL) current. GIDL current is caused by high field effect in the drain junction of metal oxide semiconductor (MOS) transistors. GIDL depends on drain-to-body voltage and drain-to-gate voltage. In some applications, GIDL current dictates performance of the system. For example, a circuit can include several CMOS switches coupled to a common terminal (e.g., a multiplexer or de-multiplexer) such that, during operation, only one CMOS switch is in the on-state and the rest of the CMOS switches are in the off-state. In such case, the GIDL currents combine and scale based on the number of switches in the off-state. The combined GIDL current can significantly impact performance of the system, particularly if the CMOS switches are operated as analog switches.

SUMMARY

Techniques for an analog switch having significantly reduced gate induced drain leakage (GIDL) current are described. In an example, an apparatus includes an analog switch having an n-type metal oxide semiconductor (NMOS) circuit in parallel with a p-type metal oxide semiconductor (PMOS) circuit between a switch input and a switch output. The analog switch is responsive to an enable signal that determines switch state thereof. The NMOS circuit includes a switch N-channel transistor coupled to a buffer N-channel transistor, a gate of the switch N-channel transistor coupled to the enable signal and a gate of the buffer N-channel transistor coupled to a modulated N-channel gate voltage. The PMOS circuit including a switch P-channel transistor coupled to a buffer P-channel transistor, a gate of the switch P-channel transistor coupled to a complement of the enable signal and a gate of the buffer P-channel transistor coupled to a modulated P-channel gate voltage. A control circuit is coupled to the analog switch to provide the modulated N-channel and modulated P-channel gate voltages each of which alternates between a respective supply voltage and a respective GIDL mitigation voltage based on the switch state.

In another example, an apparatus includes a plurality of analog switches coupled to a common terminal. Each of the plurality of analog switches responsive to a respective enable signal that determines switch state thereof. Each of the plurality of analog switches includes an NMOS circuit in parallel with a PMOS circuit between a switch input and a switch output. The NMOS circuit includes a switch N-channel transistor coupled to a buffer N-channel transistor, a gate of the switch N-channel transistor coupled to the respective enable signal and a gate of the buffer N-channel transistor coupled to a modulated N-channel gate voltage. The PMOS circuit includes a switch P-channel transistor coupled to a buffer P-channel transistor, a gate of the switch P-channel transistor coupled to a complement of the respective enable signal and a gate of the buffer P-channel transistor coupled to a modulated P-channel gate voltage. A control circuit is coupled to NMOS and PMOS circuits to provide the modulated N-channel and modulated P-channel gate voltages each of which alternates between a respective supply voltage and a respective GIDL mitigation voltage based on the switch state.

In another example, a method of operating an analog switch comprising an NMOS circuit in parallel with a PMOS circuit between a switch input and a switch output includes: coupling complementary enable signals to gates of switch transistors of the NMOS and PMOS circuits to control switch state of the analog switch; and applying modulated gate voltages to gates of buffer transistors of the NMOS and PMOS circuits, each of the modulated gate voltages alternating between a respective supply voltage and a respective gate induced drain leaking (GIDL) mitigation voltage based on the switch state.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1A:
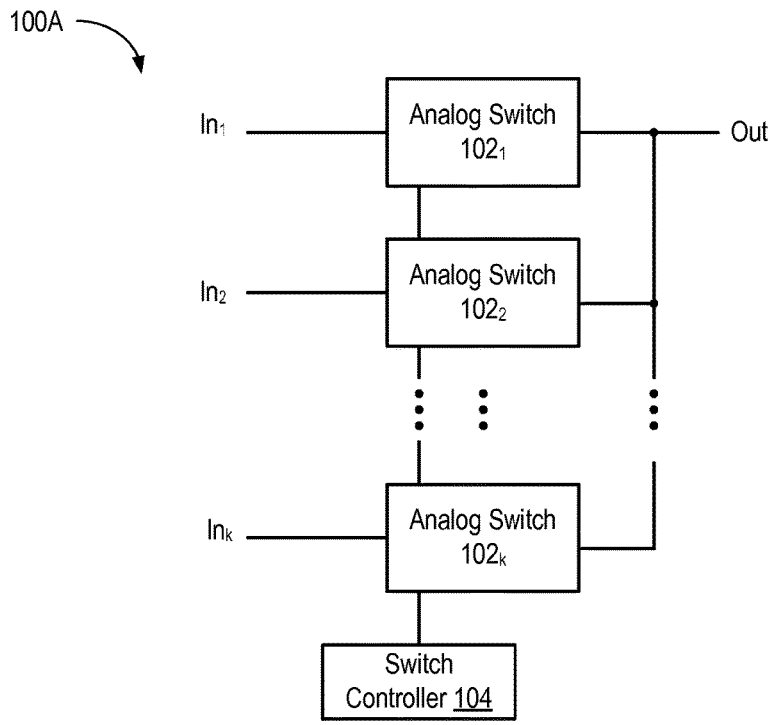
FIG. 1A is a block diagram of a multiplexer having analog switches according to examples herein.

Techniques for providing an analog switch having significantly reduced gate induced drain leakage (GIDL) current are described. In an example, an analog switch includes an n-type metal oxide semiconductor (NMOS) circuit in parallel with a p-type metal oxide semiconductor (PMOS) circuit between a switch input and a switch output. The analog switch is responsive to an enable signal that determines switch state thereof. Each of the NMOS and PMOS circuits includes a switch transistor coupled to a buffer transistor. The transistors in the NMOS circuit are N-channel transistors, and the transistors in the PMOS circuit are P-channel transistors. In some examples, the buffer transistors are coupled between the switch output and the switch transistors. In other examples, the buffer transistors are coupled between the switch input and the switch transistors. In still other examples, each of the NMOS and PMOS circuits includes a switch transistor coupled between input and output buffer transistors.

In general, a gate of the switch transistor in the NMOS circuit is coupled to the enable signal and a gate of the switch transistor in the PMOS circuit is coupled to a complement of the enable signal. When the enable signal is logic high (e.g., the switch is on), the switch transistors turn on and off in response to source voltage (e.g., voltage at the switch input) in similar fashion to a conventional CMOS switch. When the enable signal is logic low (e.g., the switch is off), the switch transistors are off.

The buffer transistors operate to reduce GIDL current induced in the switch transistors. The analog switch includes a control circuit coupled to gates of the buffer transistors to apply modulated gate voltages thereto. Each of the modulated gate voltages alternates between a respective supply voltage and a respective GIDL mitigation voltage based on switch state. When the switch is on, the control circuit applies a respective supply voltage to gates of the buffer transistors in order to turn on the buffer transistors. When the switch is off, the control circuit applies a respective GIDL mitigation voltage to gates of the buffer transistors. The GIDL mitigation voltages are configured such that the buffer transistors are either off or in a weakly on, high resistance state. When the switch is off, buffer transistors at the switch input have a reduced source-to-gate voltage, thereby having a reduced source-induced GIDL current. Likewise, buffer transistors at the switch output have a reduced drain-to-gate voltage, thereby having a reduced drain-induced GIDL current. Buffer transistors can be provided to reduce source-induced GIDL current, drain-induced GIDL current, or both.

The analog switch described herein can be used in various types of circuits. For example, the analog switch can be used in any circuit where the leakage current dictates performance of the circuit. While example circuits are described below, it is to be understood that the analog switch can be used in various other applications where it is desirable to mitigate the effects of GIDL.

FIG. 1A is a block diagram of a multiplexer 100A. The multiplexer 100A includes input terminals $(In_1)$ through $(In_k)$ (where k is an integer greater than one), analog switches $102_1$ through $102_k$ (collectively analog switches 102), and an output terminal (Out). An input of each of the analog switches $102_1$ through $102_k$ is coupled to a respective input terminal $(In_1)$ through $(In_k)$. An output of each of the analog switches 102 is coupled to a common terminal, e.g., the output terminal (Out). A switch controller 104 is coupled to control inputs of the analog switches 102 to control the state thereof. For example, the switch controller 104 can turn on one of the analog switches 102, while turning off each other one of the analog switches 102. Without compensation, leakage current flowing from the output terminal (Out) through those analog switches 102 in the off-state can be significant. As described herein, each of the analog switches 102 can be configured with buffer transistors between switch transistors and the output terminal (Out) to reduce GIDL induced in the switch transistors.

Figure 1B:
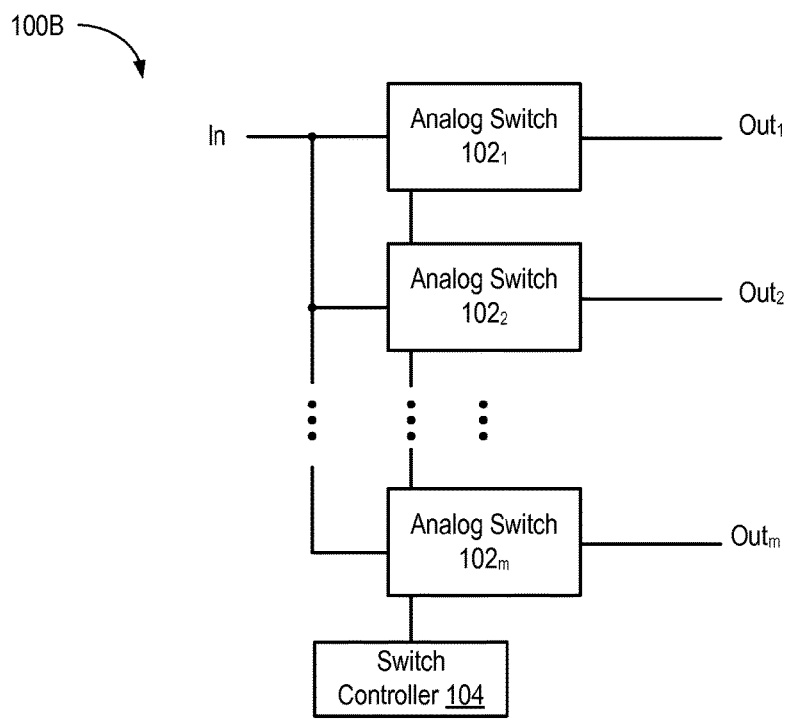
FIG. 1B is a block diagram of a de-multiplexer having analog switches according to examples herein.

FIG. 1B is a block diagram of a de-multiplexer 100B. The de-multiplexer 100B includes an input terminal (In), analog switches $102_1$ through $102_m$ (where m is an integer greater than one), and output terminals $(Out_1)$ through $(Out_m)$. An input of each of the analog switches 102 is coupled to a common terminal, e.g., the input terminal (In). An output of each of the analog switches 102 is respectively coupled to an output terminal $(Out_1)$ through $(Out_m)$. The switch controller 104 is coupled to control inputs of the analog switches 102 to control the state thereof. For example, the switch controller 104 can turn on one of the analog switches 102, while turning off each other one of the analog switches 102. Without compensation, leakage current flowing from the input terminal (In) through those analog switches 102 in the off-state can be significant. As described herein, each of the analog switches 102 can be configured with buffer transistors between switch transistors and the input terminal (In) to reduce GIDL induced in the switch transistors.

Figure 2:
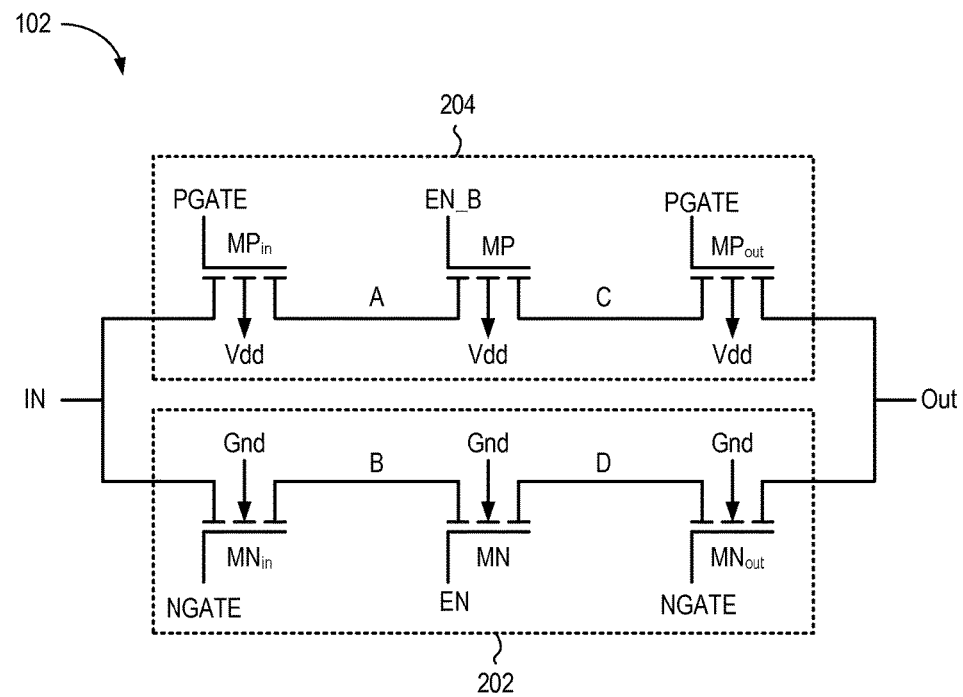
FIG. 2 is a schematic diagram showing an example analog switch having reduced gate induced drain leakage (GIDL)
Figure 2:
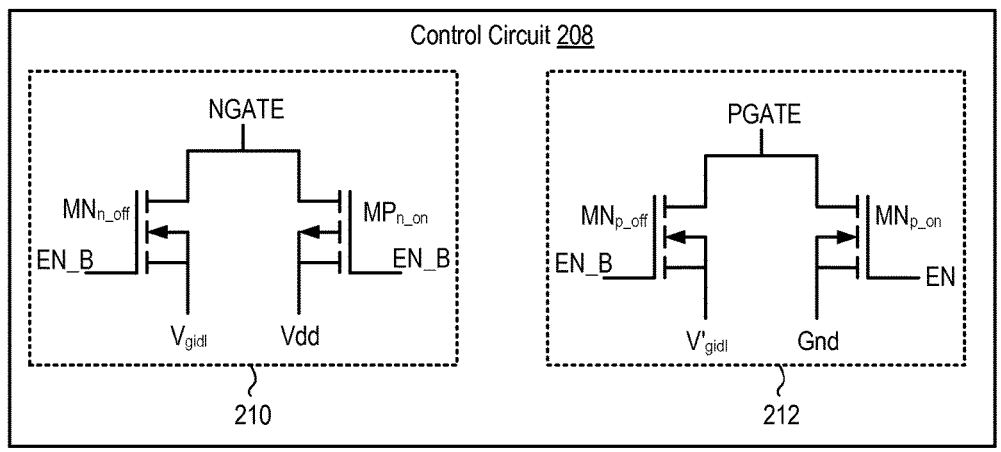

FIG. 2 is a schematic diagram showing an example analog switch 102. The analog switch 102 includes an n-type metal oxide semiconductor (NMOS) circuit 202 in parallel with a p-type metal oxide semiconductor (PMOS) circuit 204 between a switch input (IN) and a switch output (OUT). In general, each of the NMOS circuit 202 and the PMOS circuit 204 includes a switch transistor and at least one buffer transistor. In the present example, each of the NMOS circuit 202 and the PMOS circuit 204 includes both input and output buffer transistors coupled to respective source and drain of the switch transistor. In other examples, each of the NMOS circuit 202 and the PMOS circuit 204 can include only an input buffer transistor or only an output buffer transistor.

In the example shown, the NMOS circuit 202 includes a buffer transistor $(MN_{in})$, a switch transistor (MN), and a buffer transistor $(MN_{out})$. The transistors in the NMOS circuit 202 comprise N-channel transistors each having a substrate contact coupled to a supply voltage (Gnd). The supply voltage (Gnd) can be a reference voltage, such as electrical ground. The PMOS circuit 204 includes a buffer transistor $(MP_{in})$, a switch transistor (MP), and a buffer transistor $(MP_{out})$. The transistors in the PMOS circuit 204 comprise P-channel transistors each having a substrate contact coupled to a supply voltage (Vdd). The analog switch 102 can be fabricated using a complementary metal oxide semiconductor (CMOS) process as is known in the art.

Sources of the buffer transistors $(MN_{in})$ and $(MP_{in})$ are coupled to the switch input (IN). A drain of the buffer transistor $(MN_{in})$ is coupled to a source of the switch transistor (MN) (referred to as node B), and a drain of the buffer transistor $(MP_{in})$ is coupled to a source of the switch transistor (MP) (referred to as node A). A drain of the switch transistor (MN) is coupled to a source of the buffer transistor $(MN_{out})$ (referred to as node D), and a drain of the switch transistor (MP) is coupled to a source of the buffer transistor $(MP_{out})$ (referred to as node C). Drains of the buffer transistors $(MN_{out})$ and $(MP_{out})$ are coupled to the switch output (OUT).

A gate of the switch transistor (MN) is coupled to receive an enable signal (EN). A gate of the switch transistor (MP) is coupled to receive a complement of the enable signal (EN_B). The enable signal is two-state signal that controls the state of the analog switch 102. If the enable signal is logic high, the analog switch 102 is on. Conversely, if the enable signal is logic low, the analog switch 102 is off. Gates of the buffer transistors ($MN_{in}$) and ($MN_{out}$) are coupled to receive a modulated N-channel gate voltage (NGATE). Gates of the buffer transistors ($MP_{in}$) and ($MP_{out}$) are coupled to receive a modulated P-channel gate voltage (PGATE).

The analog switch 102 also includes a control circuit 208 configured to provide modulated gate voltages (NGATE) and (PGATE). The control circuit 208 can include a first circuit 210 and a second circuit 212. The first circuit 210 is configured to provide the modulated N-channel gate voltage (NGATE) for buffer transistor(s) in the NMOS circuit 202. The second circuit 212 is configured to provide a modulated P-channel gate voltage for buffer transistor(s) in the PMOS circuit 204.

The first circuit 210 of the control circuit 208 comprises an N-channel transistor ($MN_{n\_off}$) and a P-channel transistor ($MP_{n\_on}$). Drains of the transistors ($MN_{n\_off}$) and ($MP_{n\_on}$) are coupled together to provide the modulated N-channel gate voltage (NGATE). A source of the transistor ($MN_{n\_off}$) receives a GIDL mitigation voltage ($V_{gidl}$). A source of the transistor ($MP_{n\_on}$) receives the supply voltage (Vdd). Gates of the transistors ($MN_{n\_off}$) and ($MP_{n\_on}$) receive the complement of the enable signal (EN_B). In FIG. 2, NGATE refers to a common terminal such that the drains of the transistors ($MN_{n\_off}$) and ($MP_{n\_on}$) are coupled to the gates of the transistors ($MN_{in}$) and ($MN_{out}$).

The second circuit 212 of the control circuit 208 comprises an N-channel transistor ($MN_{p\_on}$) and an N-channel transistor ($MN_{p\_on}$). Drains of the transistors ($MN_{p\_off}$) and ($MN_{p\_on}$) are coupled together to provide the modulated P-channel gate voltage (PGATE). In FIG. 2, PGATE refers to a common terminal such that the drains of the transistors ($MN_{p\_off}$) and ($MN_{p\_on}$) are coupled to the gates of the transistors ($MP_{in}$) and ($MP_{out}$). A source of the transistor ($MN_{p\_off}$) receives a GIDL mitigation voltage ($V'_{gidl}$). A source of the transistor ($MN_{p\_on}$) receives the supply voltage (Gnd). Gates of the transistors ($MN_{p\_off}$) and ($MN_{p\_on}$) receive the complement of the enable signal (EN_B) and the enable signal (EN), respectively. In the example, substrate terminals of the transistors ($MN_{n\_off}$), ($MP_{n\_on}$), ($MN_{p\_off}$), and ($MN_{p\_on}$) are coupled to the respective sources thereof. In general, the substrate contacts of the NMOS devices can be coupled to the supply voltage (Gnd), and the substrate contacts of the PMOS device can be coupled to the supply voltage (Vdd).

Operation of the analog switch 102 can be understood with respect to the following example. Assume the supply voltage (Gnd) is 0V, the supply voltage (Vdd) is 1.8V, and the GIDL mitigation voltages ($V_{gidl}$) and ($V'_{gidl}$) are both 0.9V. Assume logic low equates to the supply voltage (Gnd) and logic high equates to the supply voltage (Vdd). Assume the switch input (IN) receives an analog signal that varies between the supply voltage (Gnd) and the supply voltage (Vdd).

When the analog switch 102 is on, the enable signal (EN) is at 1.8V and the complement of the enable signal (EN_B) is 0V. In such case, the transistor ($MN_{n\_on}$) is turned on, which pulls the modulated N-channel gate voltage (NGATE) to 1.8V (Vdd). Likewise, the transistor ($MP_{p\_on}$) is turned on, which pulls the modulated P-channel gate voltage (PGATE) to 0V (Gnd). In this condition, the analog switch 102 samples the switch input and the switch output follows the switch input.

When the analog switch 102 is off, the enable signal (EN) is at 0V and the complement of the enable signal (EN_B) is 1.8V. In such case, the transistor ($MN_{n\_off}$) is turned on, which pulls the modulated N-channel gate voltage (NGATE) to 0.9V ($V_{gidl}$). The buffer transistors ($MN_{in}$) and ($MN_{out}$) are either off or weakly on and, in either case, have high resistance between source and drain. Likewise, the transistor ($MP_{p\_off}$) is turned on, which pulls the modulated P-channel gate voltage (PGATE) to 0.9V ($V'_{gidl}$). The buffer transistors ($MP_{in}$) and ($MP_{out}$) are either off or weakly on and, in either case, have high resistance between source and drain. The switch transistors (MN) and (MP) are off.

Figure 3:
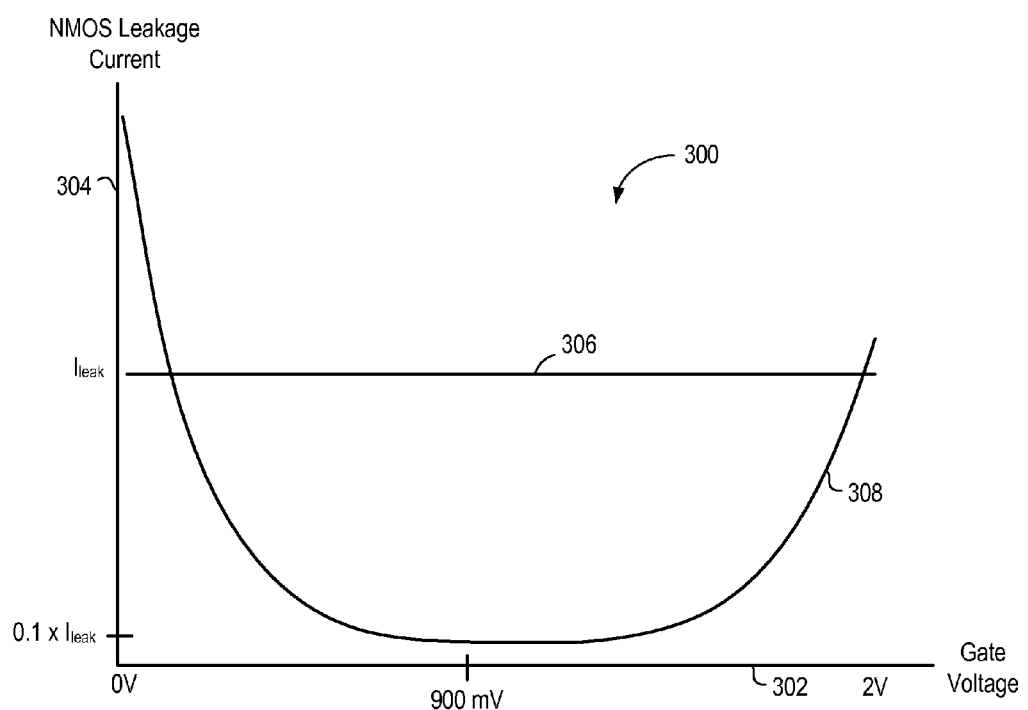
FIG. 3 is a graph showing NMOS leakage current versus gate voltage for the analog switch of FIG. 2 in the off state.

FIG. 3 is a graph 300 showing NMOS leakage current versus gate voltage for the analog switch 102 in the off state. The graph 300 includes an axis 302 representing gate voltage of a buffer transistor in the NMOS circuit 202. The graph 300 includes an axis 304 representing NMOS leakage current. For reference, a curve 306 represents the NMOS leakage current for the conventional CMOS switch in the off state (e.g., the gate voltage is always Gnd). As shown, the NMOS leakage current is substantially constant in the conventional CMOS switch at a value of $I_{leak}$. A curve 308 represents the NMOS leakage current versus gate voltage for the analog switch 102 as the gate voltage thereof varies between 0V and 2V. As shown, the NMOS leakage current is approximately double $I_{leak}$ at 0V. This assumes that the buffer transistor and the switch transistor in the NMOS circuit 202 are twice the size of the switch transistor in the conventional CMOS switch so that the on-resistance is the same between the two circuits. However, as the gate voltage increases, the NMOS leakage current of the analog switch 102 decreases and approaches $0.1 \times I_{leak}$ (ten times less than the conventional CMOS switch) (e.g., at 900 mV). As the gate voltage continues to increase towards 2V, the NMOS leakage current of the analog switch 102 begins to increase and approach $I_{leak}$. However, as shown by the curve 308, there is a range of gate voltage over which the NMOS leakage current is substantially reduced for the analog switch 102 versus the conventional CMOS switch. A similar relationship exists for PMOS leakage current versus gate voltage for the analog switch 102 and a conventional CMOS switch.

Figure 4:
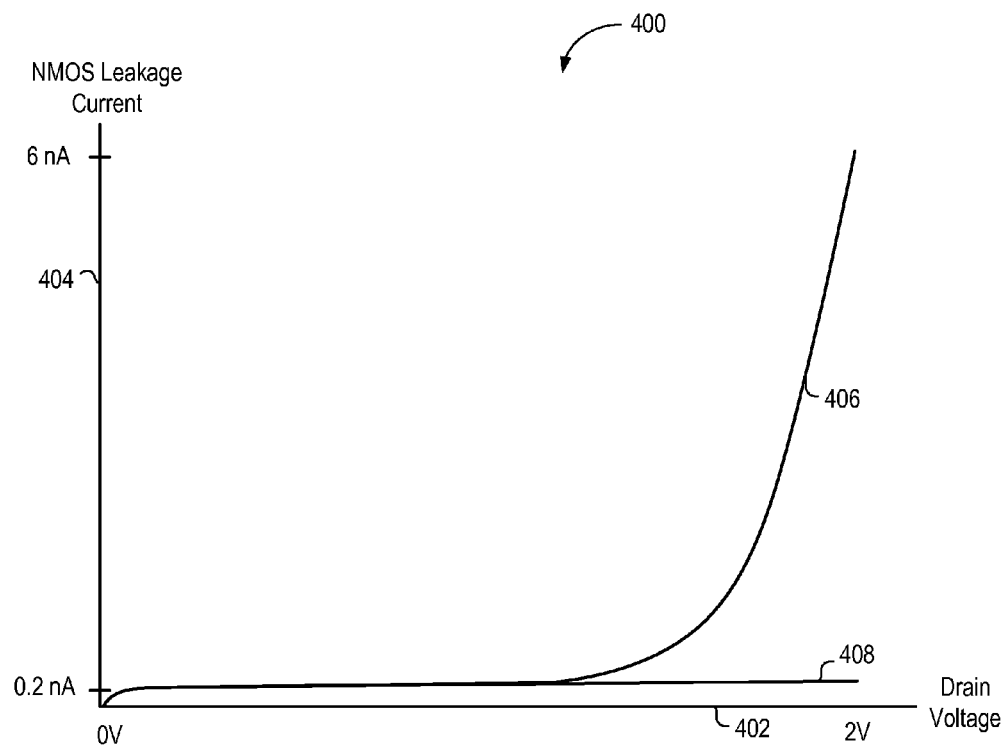
FIG. 4 is a graph showing NMOS leakage current versus drain voltage for the analog switch of FIG. 2 and for a conventional CMOS switch, each in the off state.

FIG. 4 is a graph 400 showing NMOS leakage current versus drain voltage for the analog switch 102 and for a conventional CMOS switch, each in the off state. The graph 400 includes an axis 402 representing drain voltage. For the analog switch 102, the "drain voltage" corresponds to the drain voltage of a buffer transistor in the NMOS circuit 202. For the conventional CMOS switch, the "drain voltage" corresponds to the drain voltage of the N-channel switch transistor. The graph 400 includes an axis 404 representing NMOS leakage current. As shown, a curve 406 represents NMOS leakage current for the conventional CMOS switch in the off-state (e.g., the gate voltage is GND) as the drain voltage varies between 0V and 2V. As the drain voltage increases towards 2V, the GIDL current dominates and total leakage current increases. A curve 408 represents NMOS leakage current for the analog switch 102 as the drain voltage varies between 0V and 2V. The curve 408 is substantially constant across the range of drain voltage, since the GIDL current is substantially reduced as described above. For the analog switch 102, the NMOS leakage current substantially comprises the sub-threshold leakage current. A similar relationship exists for PMOS leakage current versus drain voltage for the analog switch 102 and a conventional CMOS switch.

Figure 5:
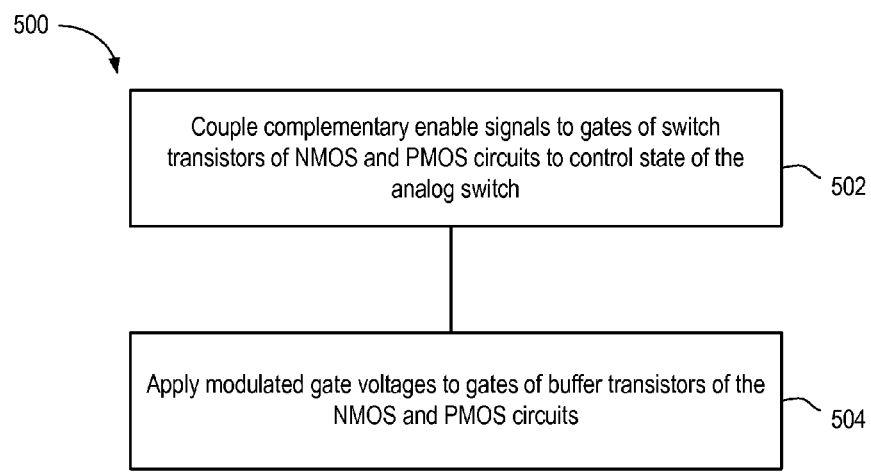
FIG. 5 is a flow diagram shown an example of a method of operating the analog switch of FIG. 2.

FIG. 5 is a flow diagram shown an example of a method 500 of operating the analog switch 102. At step 502, a switch controller (e.g., the switch controller 104) couples complementary enable signals to gates of switch transistors in the NMOS circuit 202 and the PMOS circuit 204 to control switch state of the analog switch 102. At step 504, the control circuit 208 applies modulated gate voltages to gates of buffer transistors in the NMOS circuit 202 and the PMOS circuit 204. Each of the modulated gate voltages alternates between a respective supply voltage and a respective GIDL mitigation voltage. Modulated N-channel and modulated P-channel gate voltages can be a respective supply voltage when the switch state is on and a respective GIDL voltage when the switch state is off.

Figure 6:
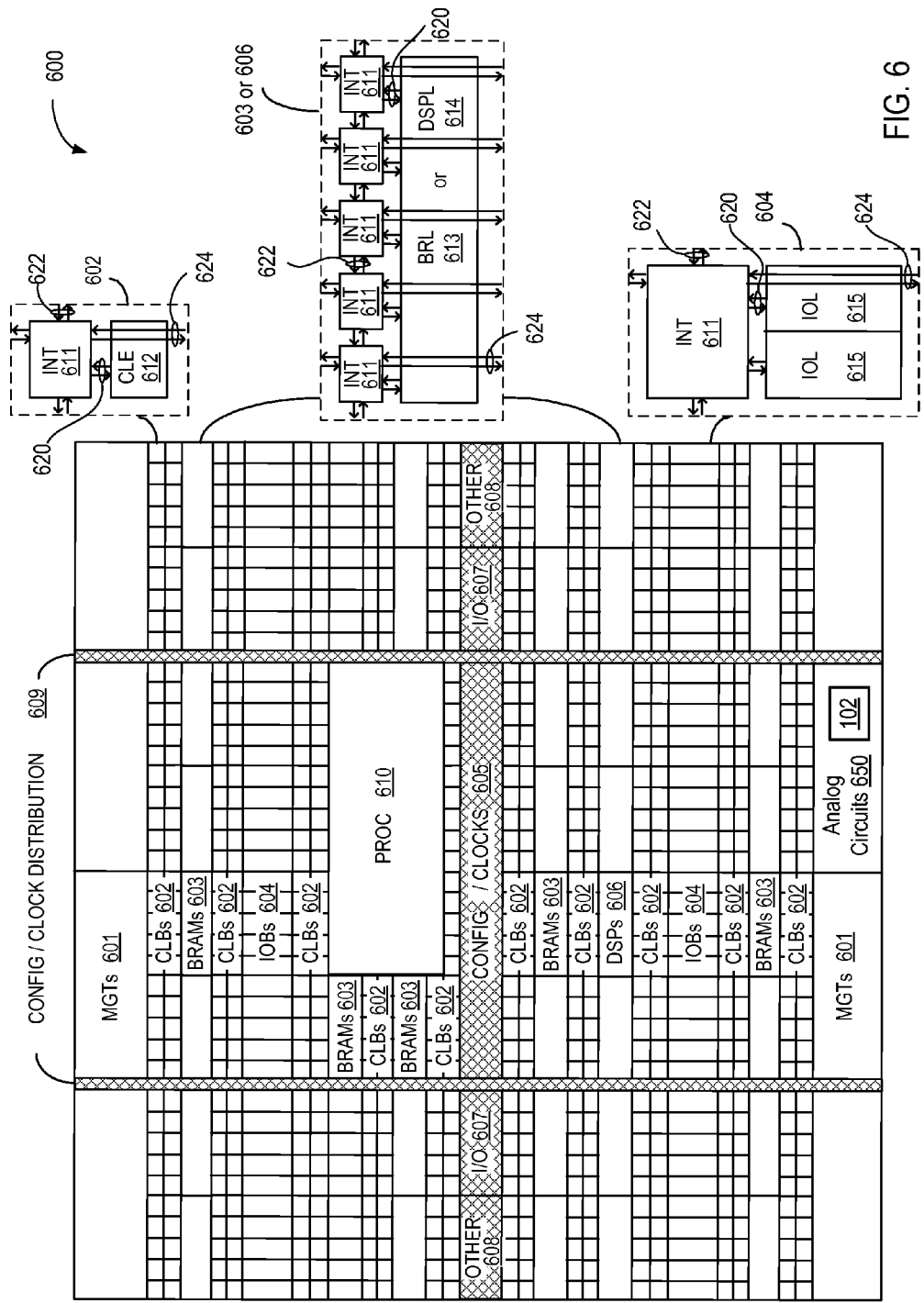
FIG. 6 illustrates an example architecture of an FPGA that can employ analog switches as described herein.

The analog switch 102 can be used in various applications, including on various integrated circuit applications. For example, the analog switch 102 can be used on a programmable integrated circuit, such as a field programmable gate array (FPGA). FIG. 6 illustrates an example architecture of an FPGA 600 that includes a large number of different programmable tiles including multi-gigabit transceivers ("MGTs") 601, configurable logic blocks ("CLBs") 602, random access memory blocks ("BRAMs") 603, input/output blocks ("IOBs") 604, configuration and clocking logic ("CONFIG/CLOCKS") 605, digital signal processing blocks ("DSPs") 606, specialized input/output blocks ("I/O") 607 (e.g., configuration ports and clock ports), and other programmable logic 608 such as digital clock managers, analog-to-digital converters, system monitoring logic, and so forth. Some FPGAs also include dedicated processor blocks ("PROC") 610.

In some FPGAs, each programmable tile can include at least one programmable interconnect element ("INT") 611 having connections to input and output terminals 620 of a programmable logic element within the same tile, as shown by examples included at the top of FIG. 6. Each programmable interconnect element 611 can also include connections to interconnect segments 622 of adjacent programmable interconnect element(s) in the same tile or other tile(s). Each programmable interconnect element 611 can also include connections to interconnect segments 624 of general routing resources between logic blocks (not shown). The general routing resources can include routing channels between logic blocks (not shown) comprising tracks of interconnect segments (e.g., interconnect segments 624) and switch blocks (not shown) for connecting interconnect segments. The interconnect segments of the general routing resources (e.g., interconnect segments 624) can span one or more logic blocks. The programmable interconnect elements 611 taken together with the general routing resources implement a programmable interconnect structure ("programmable interconnect") for the illustrated FPGA.

In an example implementation, a CLB 602 can include a configurable logic element ("CLE") 612 that can be programmed to implement user logic plus a single programmable interconnect element ("INT") 611. A BRAM 603 can include a BRAM logic element ("BRL") 613 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 606 can include a DSP logic element ("DSPL") 614 in addition to an appropriate number of programmable interconnect elements. An IOB 604 can include, for example, two instances of an input/output logic element ("IOL") 615 in addition to one instance of the programmable interconnect element 611. As will be clear to those of skill in the art, the actual I/O pads connected, for example, to the I/O logic element 615 typically are not confined to the area of the input/output logic element 615.

In the pictured example, a horizontal area near the center of the die (shown in FIG. 6) is used for configuration, clock, and other control logic. Vertical columns 609 extending from this horizontal area or column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, processor block 610 spans several columns of CLBs and BRAMs. The processor block 610 can various components ranging from a single microprocessor to a complete programmable processing system of microprocessor(s), memory controllers, peripherals, and the like.

Note that FIG. 6 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 6 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA. Moreover, the FPGA of FIG. 6 illustrates one example of a programmable IC that can employ examples of the interconnect circuits described herein. The interconnect circuits described herein can be used in other types of programmable ICs, such as complex programmable logic devices (CPLDs) or any type of programmable IC having a programmable interconnect structure for selectively coupling logic elements.

The FPGA 600 can include analog circuits 650. The analog circuits 650 can include one or more analog switches 102 in various circuit configurations. For example, the analog circuits 650 can include multiplexers, de-multiplexers, and the like where leakage current has a significant impact on circuit operation. The analog switches 102 can be employed to reduce leakage current, as described above.

While the foregoing is directed to specific examples, other and further examples may be devised without departing from the basic scope thereof, and the scope thereof is determined by the claims that follow.

What is claimed is:
1. An apparatus, comprising:
an analog switch including an n-type metal oxide semiconductor (NMOS) circuit in parallel with a p-type metal oxide semiconductor (PMOS) circuit between a switch input and a switch output, the analog switch responsive to an enable signal that determines switch state thereof;
the NMOS circuit including a switch N-channel transistor coupled to a buffer N-channel transistor, a gate of the switch N-channel transistor coupled to the enable signal and a gate of the buffer N-channel transistor coupled to a modulated N-channel gate voltage;
the PMOS circuit including a switch P-channel transistor coupled to a buffer P-channel transistor, a gate of the switch P-channel transistor coupled to a complement of the enable signal and a gate of the buffer P-channel transistor coupled to a modulated P-channel gate voltage; and
a control circuit coupled to the analog switch and receiving the enable signal, the control circuit configured to:

provide the modulated N-channel gate voltage as alternating between a first supply voltage and a first gate induced drain leakage (GIDL) mitigation voltage based on the state of the enable signal; and provide the modulated P-channel gate voltage as alternating between a second supply voltage and a second GIDL mitigation voltage based on the state of the enable signal.

2. The apparatus of claim 1, wherein each of the modulated N-channel and modulated P-channel gate voltages is a respective supply voltage when the switch state is on and a respective GIDL mitigation voltage when the switch state is off.

3. The apparatus of claim 1, wherein the first supply voltage comprises a positive voltage and the second supply voltage comprises a reference voltage, and wherein the first and second GIDL mitigation voltages are between the positive voltage and the reference voltage.

4. The apparatus of claim 3, wherein each of the first and second GIDL mitigation voltages are approximately equal to half of the difference between the positive voltage and the reference voltage.

5. The apparatus of claim 1, wherein the control circuit comprises:
a first circuit coupled to apply the modulated N-channel gate voltage to the gate of the buffer N-channel transistor; and
a second circuit coupled to apply the modulated P-channel gate voltage to the gate of the buffer P-channel transistor.

6. The apparatus of claim 5, wherein the first circuit comprises:
an N-channel transistor having a source coupled to the first GIDL mitigation voltage, a drain coupled to the gate of the buffer N-channel transistor, and a gate coupled to the complement of the enable signal; and
a P-channel transistor having a source coupled to the first supply voltage, a drain coupled to the gate of the buffer N-channel transistor, and a gate coupled to the complement of the enable signal.

7. The apparatus of claim 5, wherein the second circuit comprises:
a first N-channel transistor having a source coupled to the second GIDL mitigation voltage, a drain coupled to the gate of the buffer P-channel transistor, and a gate coupled to the complement of the enable signal; and
a second N-channel transistor having a source coupled to the second supply voltage, a drain coupled to the gate of the buffer P-channel transistor, and a gate coupled to the enable signal.

8. The apparatus of claim 1, wherein the buffer N-channel transistor and the buffer P-channel transistor are coupled between the switch output and respective drains of the switch N-channel transistor and the switch P-channel transistor.

9. The apparatus of claim 1, wherein the buffer N-channel transistor and the buffer P-channel transistor are coupled between the switch input and respective sources of the switch N-channel transistor and the switch P-channel transistor.

10. The apparatus of claim 9, wherein:
the buffer N-channel transistor comprises an input buffer N-channel transistor and the buffer P-channel transistor comprises an input buffer P-channel transistor;
the NMOS circuit includes an output buffer N-channel transistor coupled between the switch output and a drain of the switch N-channel transistor, a gate of the output buffer N-channel transistor coupled to the modulated N-channel gate voltage; and
the PMOS circuit includes an output buffer P-channel transistor coupled between the switch output and a drain of the switch P-channel transistor, a gate of the output buffer P-channel transistor coupled to the modulated P-channel gate voltage.

11. An apparatus, comprising:
a plurality of analog switches coupled to a common terminal, each of the plurality of analog switches responsive to a respective enable signal that determines switch state thereof, each of the plurality of analog switches comprising:
an n-type metal oxide semiconductor (NMOS) circuit in parallel with a p-type metal oxide semiconductor (PMOS) circuit between a switch input and a switch output;
the NMOS circuit including a switch N-channel transistor coupled to a buffer N-channel transistor, a gate of the switch N-channel transistor coupled to the respective enable signal and a gate of the buffer N-channel transistor coupled to a modulated N-channel gate voltage;
the PMOS circuit including a switch P-channel transistor coupled to a buffer P-channel transistor, a gate of the switch P-channel transistor coupled to a complement of the respective enable signal and a gate of the buffer P-channel transistor coupled to a modulated P-channel gate voltage; and
a control circuit coupled to NMOS and PMOS circuits and receiving the enable signal, the control circuit configured to:
provide the modulated N-channel gate voltage as alternating between a first supply voltage and a first gate induced drain leakage (GIDL) mitigation voltage based on the state of the enable signal; and
provide the modulated P-channel gate voltage as alternating between a second supply voltage and a second GIDL mitigation voltage based on the state of the enable signal.

12. The apparatus of claim 11, wherein each of the modulated N-channel and modulated P-channel gate voltages is a respective supply voltage when the switch state is on and a respective GIDL mitigation voltage when the switch state is off.

13. The apparatus of claim 11, wherein the first supply voltage comprises a positive voltage and the second supply voltage comprises a reference voltage, and wherein the first and second GIDL mitigation voltages are between the positive voltage and the reference voltage.

14. The apparatus of claim 11, wherein the control circuit comprises:
a first circuit coupled to apply the modulated N-channel gate voltage to the gate of the buffer N-channel transistor, the first circuit including:
an N-channel transistor having a source coupled to the first GIDL mitigation voltage, a drain coupled to the gate of the buffer N-channel transistor, and a gate coupled to the complement of the enable signal; and
a P-channel transistor having a source coupled to the first supply voltage, a drain coupled to the gate of the buffer N-channel transistor, and a gate coupled to the complement of the enable signal; and
a second circuit coupled to apply the modulated P-channel gate voltage to the gate of the buffer P-channel transistor, the second circuit including:

a first N-channel transistor having a source coupled to the second GIDL mitigation voltage, a drain coupled to the gate of the buffer P-channel transistor, and a gate coupled to the complement of the enable signal; and a second N-channel transistor having a source coupled to the second supply voltage, a drain coupled to the gate of the buffer P-channel transistor, and a gate coupled to the enable signal.

15. A method of operating an analog switch comprising an n-type metal oxide semiconductor (NMOS) circuit in parallel with a p-type metal oxide semiconductor (PMOS) circuit between a switch input and a switch output, the method comprising:

coupling complementary enable signals to gates of switch transistors of the NMOS and PMOS circuits to control switch state of the analog switch; and applying modulated gate voltages to gates of buffer transistors of the NMOS and PMOS circuits, each of the modulated gate voltages alternating between a respective supply voltage and a respective gate induced drain leaking (GIDL) mitigation voltage based on states of the complementary enable signals.

16. The method of claim 15, wherein the analog switch is one of a plurality of analog switches coupled to a common terminal, and the buffer transistors are coupled between the switch transistors and the common terminal.

17. The method of claim 15, wherein each of the modulated gate voltages is a respective supply voltage when the switch state is on and a respective GIDL mitigation voltage when the switch state is off.

* * * * *